(12) United States Patent
Ramakrishna et al.

(10) Patent No.: US 7,729,097 B2
(45) Date of Patent: Jun. 1, 2010

(54) OVER-VOLTAGE AND UNDER VOLTAGE PROTECTION CIRCUIT

(75) Inventors: Purushotham Ramakrishna, Bangalore (IN); Sakthi Prashanth Turaga, Bangalore (IN)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 12/144,124

(22) Filed: Jun. 23, 2008

(65) Prior Publication Data

US 2009/0002905 A1    Jan. 1, 2009

Related U.S. Application Data

(63) Continuation of application No. PCT/EP2005/014182, filed on Dec. 23, 2005.

(51) Int. Cl.
*H02H 9/00* (2006.01)
(52) U.S. Cl. .................................... 361/56
(58) Field of Classification Search ............ 361/56
See application file for complete search history.

(56) References Cited

U.S. PATENT DOCUMENTS

| 5,486,778 | A | * | 1/1996 | Lou ........................... 326/71 |
| 5,793,592 | A | | 8/1998 | Adams et al. |
| 5,867,015 | A | * | 2/1999 | Corsi et al. ............. 323/316 |
| 6,163,179 | A | | 12/2000 | Huang et al. |
| 6,798,629 | B1 | * | 9/2004 | Proebsting ............... 361/56 |

FOREIGN PATENT DOCUMENTS

DE          37 29 926 A1     3/1989

OTHER PUBLICATIONS

Author Unknown, "Fast Level Converter Circuit," IBM Technical Disclosure Bulletin, May 1987, 2 pages, vol. 29, No. 12, IBM Corporation, US.

* cited by examiner

*Primary Examiner*—Stephen W Jackson
(74) *Attorney, Agent, or Firm*—Slater & Matsil, L.L.P.

(57) ABSTRACT

There is provided an apparatus for protection against over voltages and/or under voltages. The apparatus includes a pass transistor through which an input voltage is applied, the input voltage varying between a low voltage and a high voltage, and means for selectively varying the gate voltage of the pass transistor when the input voltage is transitioning from the low voltage to the high voltage or from the high voltage to the low voltage. The pass transistor may include an NMOS or a PMOS transistor.

19 Claims, 4 Drawing Sheets

OVER-VOLTAGE AND UNDER VOLTAGE PROTECTION CIRCUIT

This application is a continuation of co-pending International Application No. PCT/EP2005/014182, filed Dec. 23, 2005, which designated the United States and was published in English and which application is incorporated herein by reference.

FIELD OF THE INVENTION

The present invention relates to a protection circuit for protecting an input buffer from the gate oxide stress caused by overshoots or undershoots on the transmission line, and to receivers which receive signals from voltage domains different from their supply voltages.

BACKGROUND OF THE INVENTION

It is conventional to include an input buffer between an input pad and the components of an electronic circuit. It is desirable to include some form of protection to ensure that the input voltage to the input buffer is not outside the range of voltages for which the input buffer is designed. If the voltage applied to the input buffer is outside the voltage range for which the input buffer is designed, there is a risk that the transistors forming the input buffer circuitry will be stressed.

Typically, over voltage protection is achieved by the use of an NMOS pass transistor which is connected between the input pad and the input buffer. The gate of the NMOS pass transistor is connected to a normal signal voltage. If the voltage applied to the pad is greater that the maximum input voltage, the voltage applied to the input of the input buffer is limited by the threshold drop of the transistor. However, the use of an NMOS pass transistor means that there is a reduction in the input voltage applied to the input buffer even when the voltage is within a normal range. Therefore, when the input voltage corresponds to a high logic, the voltage applied to the input buffer will be less than the normal maximum input voltage. This can result in duty cycle distortion.

Furthermore, the use of a pass transistor is not able to compensate for under voltages. Indeed, when the voltage is below a normal lower signal level, the gate oxide of the pass transistor itself will be stressed.

It would be advantageous to be able to provide a voltage protection circuit which is able to protect an input buffer from under voltages and over voltages in the transmission line without unduly compromising the performance of the device, for example, in terms of duty cycle and operation speed, and without unduly stressing the transistors of the protection circuit or of the input buffer.

SUMMARY OF THE INVENTION

According to a first aspect of the invention, there is provided an apparatus for protection against over voltages and/or under voltages, the apparatus comprising: a pass transistor through which an input voltage is applied, the input voltage varying between a low voltage (0) and a high voltage (1); and means for selectively varying the gate voltage of the pass transistor when the input voltage is transitioning from the low voltage to the high voltage or from the high voltage to the low voltage.

In prior art arrangements, the pass transistor is an NMOS transistor and the gate voltage of the pass transistor is maintained at a predetermined voltage which is typically lower than the maximum normal input voltage. Thus, over voltage protection is achieved. In the invention, however, the pass transistor may be an NMOS or a PMOS and the gate voltage of the pass transistor is able to vary selectively when the input signal voltage is transitioning between 0 and 1 or 1 and 0 voltage levels. Thus, higher level input voltages (in the case of NMOS) or lower level input voltages (in the case of PMOS) can be temporarily passed by the pass transistor. By allowing the input voltage to be passed by the pass transistor, the input buffer can operate more reliably, for example, without affecting hysteresis and without causing timing problems, such as duty cycle distortions.

In a first embodiment, the pass transistor comprises an NMOS transistor.

In the first embodiment, the means for selectively varying the gate voltage of the pass transistor is preferably arranged to increase the gate voltage only when the input voltage is switching from the low voltage to the high voltage. Thus, with an NMOS transistor used as the pass transistor, over voltage protection is achieved by allowing the gate voltage to temporarily increase during a low to high transition.

In the first embodiment, the means for selectively varying the gate voltage of the pass transistor is preferably arranged to return the gate voltage to a supply voltage after the input voltage has switched from the low voltage to the high voltage. Once the input voltage has switched from low to high, the gate voltage returns to the supply voltage and the pass transistor behaves just like a conventional pass transistor, with a fixed gate voltage.

In the first embodiment, the apparatus may further comprise a pull-up transistor to pull up the voltage passed by the pass transistor to a source voltage.

In the first embodiment, the apparatus may be coupled to an input buffer including a hysteresis circuit, and the means for selectively varying the gate voltage of the pass transistor is preferably arranged to return the gate voltage to a supply voltage when the input voltage passed to the input buffer exceeds a first switching voltage of the hysteresis circuit.

In a second embodiment, the pass transistor comprises a PMOS transistor.

In the second embodiment, the means for selectively varying the gate voltage of the pass transistor is preferably arranged to decrease the gate voltage only when the input voltage is switching from the high voltage to the low voltage.

Thus, with a PMOS transistor used as the pass transistor, under voltage protection is achieved by allowing the gate voltage to temporarily decrease during a high to low transition.

In the second embodiment, the means for selectively varying the gate voltage of the pass transistor is preferably arranged to return the gate voltage to a supply voltage after the input voltage has switched from the high voltage to the low voltage. Once the input voltage has switched from high to low, the gate voltage returns to a supply voltage and the pass transistor behaves just like a conventional pass transistor, with a fixed gate voltage.

In the second embodiment, the apparatus may further comprise a pull-down transistor to pull down the voltage passed by the pass transistor to ground voltage.

In the second embodiment, the apparatus may be coupled to an input buffer including a hysteresis circuit, and the means for selectively varying the gate voltage of the pass transistor is preferably arranged to return the gate voltage to a supply voltage when the input signal voltage passed to the input buffer passes below a second switching voltage of the hysteresis circuit.

Advantageously, the apparatus further comprises a supply voltage different from the normal input voltage. By using a supply voltage different from the normal input voltage, an NMOS transistor used as the pass transistor can also protect against under voltage damage and a PMOS transistor used as the pass transistor can also protect against over voltage damage.

In that case, in the first embodiment, the means for selectively varying the gate voltage of the pass transistor is preferably arranged to clamp the gate voltage at a supply voltage only when the input voltage is switching from the high voltage to the low voltage.

In that case, in the second embodiment, the means for selectively varying the gate voltage of the pass transistor is preferably arranged to clamp the gate voltage at a supply voltage only when the input voltage is switching from the low voltage to the high voltage.

In one arrangement, the means for selectively varying the gate voltage of the pass transistor includes a coupling capacitor coupling the input voltage to the gate of the pass transistor. In that arrangement, the gate of the pass transistor may be coupled to a supply voltage through one or more transistors.

The apparatus may be coupled to an input buffer. The input buffer may include a hysteresis circuit.

According to the first aspect of the invention, there is also provided an apparatus for protection against over voltages, the apparatus comprising: a NMOS transistor through which an input voltage is applied, the input voltage varying between a low voltage (0) and a high voltage (1); and means for increasing the gate voltage of the NMOS transistor only when the input voltage is transitioning from the low voltage to the high voltage.

In that case, the apparatus may be further arranged to protect against under voltages and the NMOS transistor may be arranged to clamp the gate voltage at a supply voltage only when the input voltage is switching from the high voltage to the low voltage.

According to the first aspect of the invention, there is also provided an apparatus for protection against under voltages, the apparatus comprising a PMOS transistor through which an input voltage is applied, the input voltage varying between a low voltage (0) and a high voltage (1); and means for decreasing the gate voltage of the PMOS transistor only when the input voltage is transitioning from the high voltage to the low voltage.

In that case, the apparatus may be further arranged to protect against over voltages and the PMOS transistor may be arranged to clamp the gate voltage at a supply voltage only when the input voltage is switching from the low voltage to the high voltage.

According to a second aspect of the invention, there is provided a receiver comprising apparatus according to the first aspect of the invention.

According to a third aspect of the invention, there is provided a method for protecting against over voltages and/or under voltages, the method comprising the steps of: applying an input voltage to the source of a pass transistor, the input voltage varying between a low voltage (0) and a high voltage (1); and selectively varying the gate voltage of the pass transistor when the input voltage is transitioning from the low voltage to the high voltage or from the high voltage to the low voltage.

According to the third aspect of the invention, there is also provided a method for protecting against over voltages, the method comprising the steps of: applying an input voltage to the source of an NMOS transistor, the input voltage varying between a low voltage (0) and a high voltage (1); and increasing the gate voltage of the NMOS transistor only when the input voltage is transitioning from the low voltage to the high voltage.

In that case, the method may further comprise the step of clamping the gate voltage at a supply voltage only when the input voltage is switching from the high voltage to the low voltage.

According to the third aspect of the invention, there is also provided a method for protecting against under voltages, the method comprising the steps of: applying an input voltage to the source of a PMOS transistor, the input voltage varying between a low voltage (0) and a high voltage (1); and decreasing the gate voltage of the PMOS transistor only when the input voltage is transitioning from the high voltage to the low voltage.

In that case, the method may further comprise the step of clamping the gate voltage at a supply voltage only when the input voltage is switching from the low voltage to the high voltage.

Features described in relation to one aspect of the invention may also be applicable to another aspect of the invention.

BRIEF DESCRIPTION OF THE DRAWINGS

Embodiments of the present invention will now be described by way of example, with reference to the accompanying drawings, of which.

DETAILED DESCRIPTION OF PREFERRED EMBODIMENTS

Figure 1A:
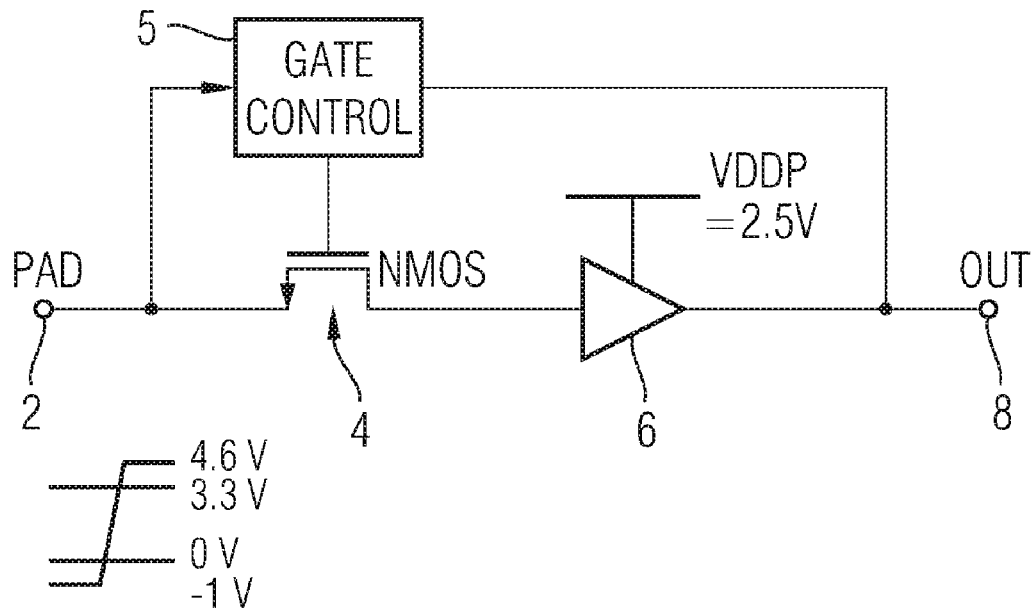
FIG. 1a is a circuit diagram of a protection circuit according to a first embodiment of the present invention.
Figure 1B:
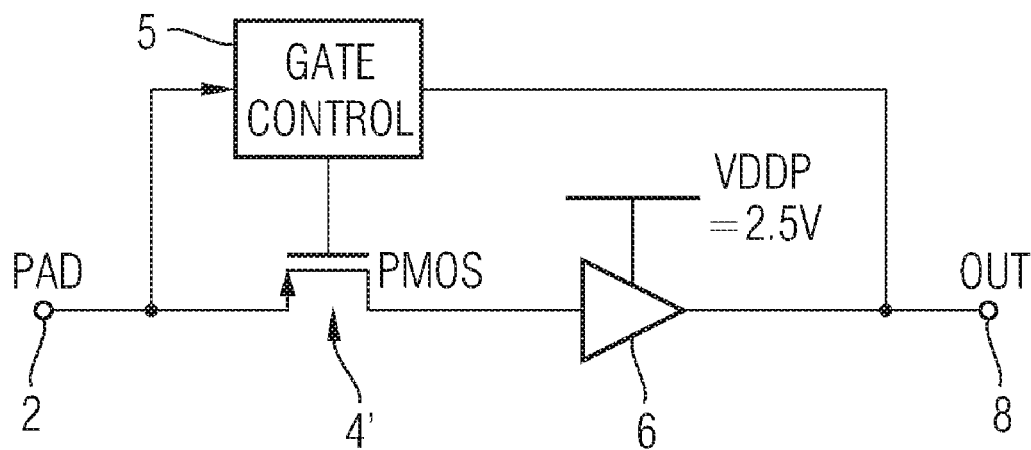
FIG. 1b is a circuit diagram of a protection circuit according to a second embodiment of the present invention.

FIG. 1a shows a circuit diagram of a protection circuit according to a first embodiment of the invention. FIG. 1b shows a circuit diagram of a protection circuit according to a second embodiment of the invention. FIGS. 1a and 1b illustrate the basic principles behind the invention.

Referring to FIG. 1a, an incoming signal is applied to a pad 2 which is connected to the source of a pass transistor 4 (which is an NMOS transistor) and also to one input of a gate control circuit 5. The gate of the pass transistor 4 is connected to the output of the gate control circuit 5 and the drain of the pass transistor 4 is connected to the input of a hysteresis inverting stage 6. The output of the hysteresis stage 6 is connected to a further input to the gate control circuit 5 and also to an output 8 of the circuit.

The present invention is of particular applicability to a Universal Serial Bus (USB) receiver circuit. The normal signaling level for a USB is 0 to 3.3 V. However, the signaling voltage applied to the pad 2 may, in practice, range from −1 to 4.6 V due to transmission line mismatches. When the pad voltage is outside the normal operating range of the circuit, there is the risk of gate oxide stress in the transistors forming the protection circuit or in the input buffer.

As shown in FIG. 1a, a 2.5V input stage is provided to detect the 3.3V signaling level. The use of a 2.5V input stage ensures that there will be no gate stress during undershoots (i.e., during a transition from a high voltage (1) to a low voltage (0)). However, if the gate voltage of the pass transistor 4 is connected to a 2.5V supply voltage, the pass transistor 4 will be unable to pass voltages greater than 2.5V less the threshold voltage of the pass transistor 4. This may affect the hysteresis (Vih-ViI) and timing requirements such as the duty cycle of the device. Therefore, according to the present invention, the gate voltage of the pass transistor 4 is increased temporarily by the gate control circuit 5 when a high voltage is to be passed by the pass transistor 4. When the voltage returns to a lower level, the voltage applied to the gate of the pass transistor 4 is returned to the lower level. The temporary increase of the gate voltage of the pass transistor 4 when the signaling voltage is increasing (i.e., when transitioning from low voltage (0) to high voltage (1)), may be achieved by a coupling capacitor in the gate control circuit 5, and this is described in more detail in connection with FIG. 2. The temporary increase in the gate voltage protects the input buffer from an over voltage whilst ensuring that the signal passed to the input buffer by the pass transistor 4 corresponds to the input signal.

Thus, with an NMOS used as the pass transistor 4, the arrangement deals with overshoots by temporarily increasing the gate voltage when the input voltage has a rising edge and deals with undershoots by providing a supply voltage different from the normal signaling voltage.

FIG. 1b is exactly the same as FIG. 1a except that a PMOS transistor, rather than an NMOS transistor, is used as the pass transistor, now labeled 4'.

An incoming signal is applied to a pad 2 which is connected to the source of a pass transistor 4' and also to one input of a gate control circuit 5. The gate of the pass transistor 4' is connected to the output of the gate control circuit 5 and the drain of the pass transistor 4' is connected to the input of a hysteresis inverting stage 6. The output of the hysteresis stage 6 is connected to a further input to the gate control circuit 5 and also to an output 8 of the circuit.

In the case of FIG. 1b, the gate control circuit 5 will reduce the gate voltage on the pass transistor 4' when the input voltage is on a falling edge. A PMOS pass transistor will be unable to pass voltages less than the threshold voltage of the pass transistor. Again, this may affect the hysteresis (Vih-ViI) and timing requirements such as the duty cycle of the device. Therefore, when a PMOS transistor is used as the pass transistor 4', the gate voltage of the pass transistor 4' is reduced temporarily by the gate control circuit 5 when a low voltage is to be passed by the pass transistor 4'. When the voltage returns to a higher level, the voltage applied to the gate of the pass transistor 4' is returned to the higher level. The temporary decrease of the gate voltage of the pass transistor 4 when the signaling voltage is decreasing (i.e., when transitioning from high voltage (1) to low voltage (0)) may be achieved by a coupling capacitor in the gate control circuit 5, and this is described in more detail in connection with FIG. 2. The temporary decrease in the gate voltage protects the input buffer from an under voltage whilst ensuring that the signal passed to the input buffer by the pass transistor 4' corresponds to the input signal.

Thus, with a PMOS transistor used as the pass transistor 4', the arrangement deals with undershoots by temporarily decreasing the gate voltage when the input voltage has a falling edge.

Figure 2:
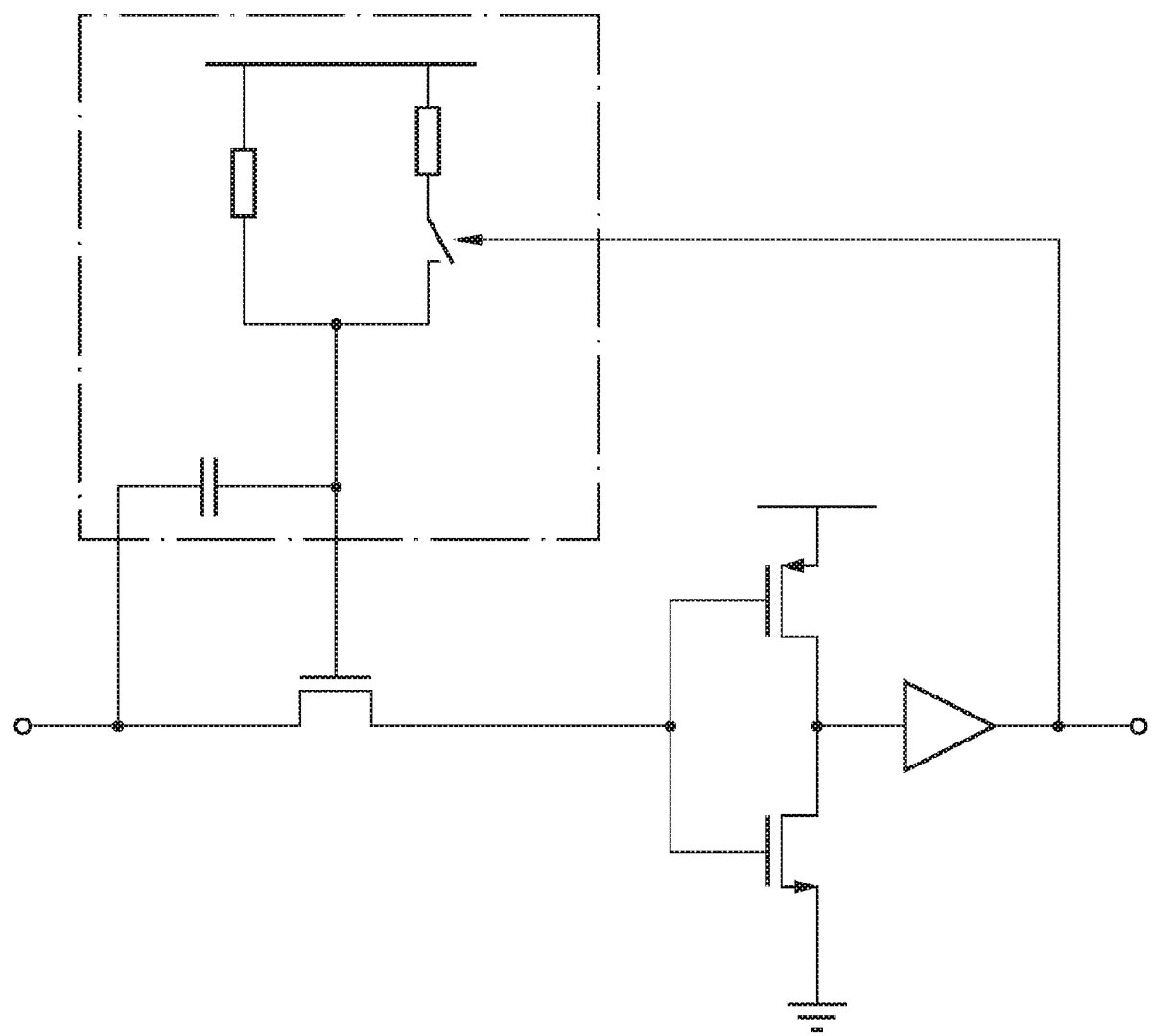
FIG. 2 is a circuit diagram of a protection circuit according to a third embodiment of the present invention.

FIG. 2 shows a circuit diagram of a second embodiment in which the gate control circuit 5 comprises two resistive elements, one of which is switchable. The same reference numerals have been used in FIGS. 1 to 3 to denote like components. In the embodiment shown in FIG. 2, the input signal is applied to a pad 2 which is connected to the source of a pass transistor 4 (which may be a PMOS or an NMOS, as will be discussed below) and also to a first terminal of a capacitor 12, the second terminal of the capacitor 12 being connected to the gate of the pass transistor 4. The gate of the pass transistor 4 is also connected to a first terminal of a first resistive element 13 and to the first terminal of a switch 15. The second terminal of the switch 15 is connected to a first terminal of a further resistive element 17. The second terminals of the resistive elements 13 and 17 are both connected to a supply VDDX. The drain of the pass transistor 4 is coupled to the gate of a PMOS transistor 19 and also to the gate of an NMOS transistor 20. The source of the PMOS transistor 19 is connected to a supply VDDB and the source of the NMOS transistor 20 is connected to ground. The drains of the PMOS transistor 19 and the NMOS transistor 20 are connected together and these are further connected to the input of the hysteresis unit 6. The output of the hysteresis unit 6 is connected to the control terminal of the switch 15. The switch 15 is preferably an electronic switch rather than a mechanical device.

If the pass transistor is an NMOS transistor, operation of the FIG. 2 arrangement is as follows. When the input signal at the pad 2 starts to rise (i.e., the input signal is transitioning from a low voltage (0) to a high voltage (1)), the coupling capacitor 12 causes the gate of the pass transistor 4 to rise above VDDX to which it is coupled via the resistive element 13 which has a high resistance. This enables the signal level to be passed accurately to the input of the hysteresis stage 6. This means that the input to the hysteresis stage 6 crosses a first switching level and is turned ON. When the input signal at the pad 2 starts to fall (i.e., the input signal is transitioning from a high voltage (1) to a low voltage (0)), the gate voltage of the pass transistor 4 starts to fall due to the coupling through the capacitor 12. However, because the hysteresis stage 6 is ON, the output of the hysteresis stage 6 is connecting the resistive element 17 in parallel with the resistive element 13 (because switch 15 is closed). The resistive element 17 has a low resistance and restricts the voltage change at the gate of the pass transistor 4 to a very low level retaining the gate substantially at the potential VDDX. The gate voltage is held very stable. Thus, the input signal is transferred accurately to the input of the hysteresis stage 6. The two resistive elements 13 and 17 may be, for example, MOS devices, polyresistors, or any other element which can provide resistance.

When the signal at the drain of the pass transistor 4 rises, the NMOS transistor 20 conducts, pulling the input to the hysteresis stage 6 down to ground potential. Similarly, when the voltage at the drain of the pass transistor 4 falls, the PMOS transistor 19 conducts and pulls the input to the hysteresis stage 6 to the potential VDDB. Thus the input to the hysteresis stage 6 will be switched between ground potential and VDDB and it is thus protected from over swings and under swings of the input voltage at the pad 2.

The pass transistor 4 could alternatively be a PMOS transistor. In that case, when the input signal starts to fall (high to low voltage transition), the gate of the pass transistor 4 drops, allowing the signal level to be passed accurately to the hysteresis stage 6. When the input signal starts to rise (low to high voltage transition), the gate voltage rises close to voltage VDDX by connection of the resistive element 17 so the input signal is accurately transferred to the hysteresis stage 6.

Figure 3:
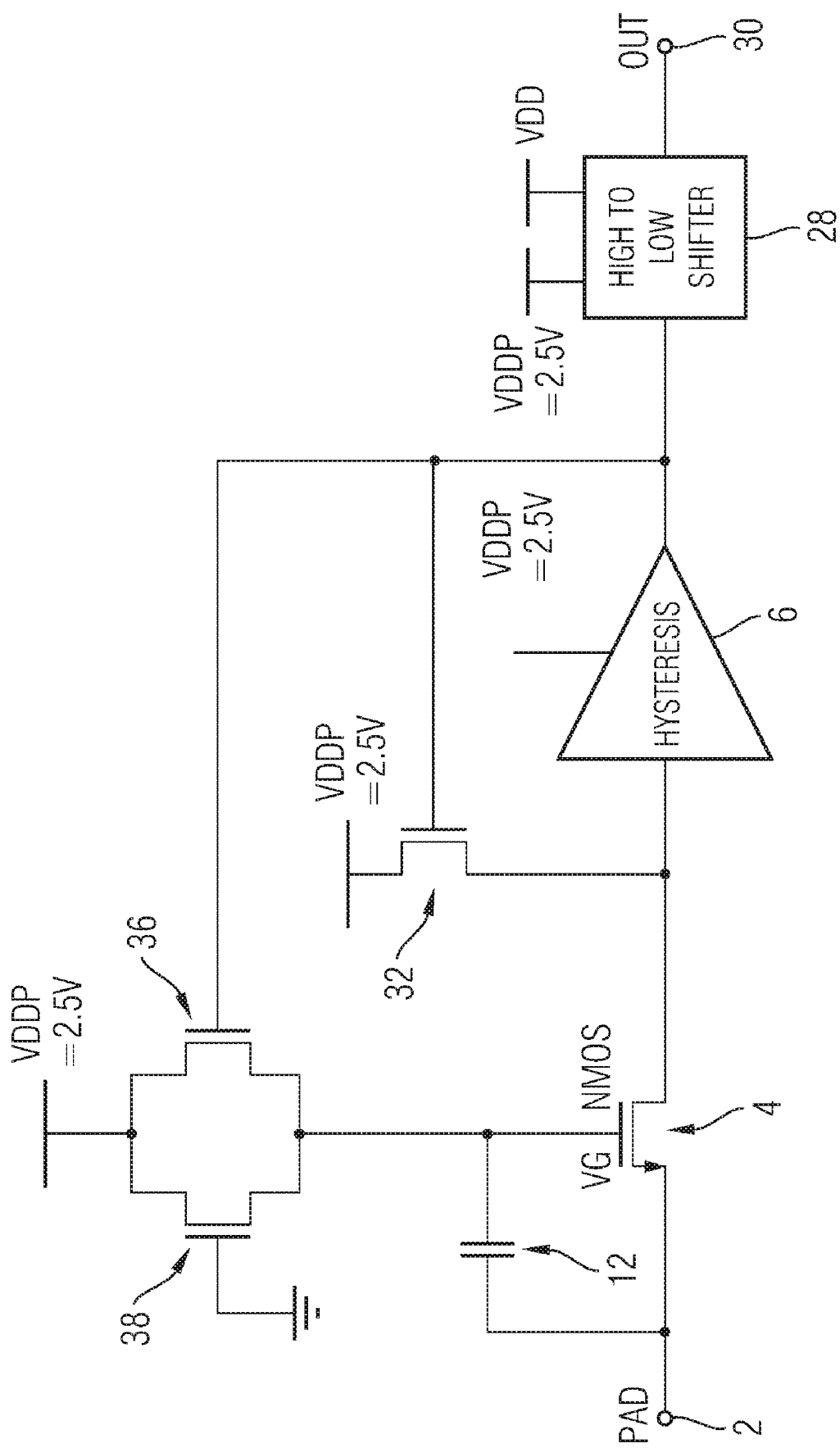
FIG. 3 shows a detailed circuit diagram of one implementation of the present invention.

FIG. 3 shows a circuit diagram of one implementation of the present invention. The protection circuit shown in FIG. 3 includes an NMOS pass transistor 4 connected between an input pad 2 and the input to a hysteresis stage 6. The output of the hysteresis stage 6 is connected to a high-low level shifter circuit 28, the output of which is connected to an output 30. A coupling capacitor 12 is connected between the input pad 2 and the gate of the pass transistor 4. Two PMOS transistors 36 and 38 are connected in parallel between voltage source VDDP and the gate of the pass transistor 4. The gate of PMOS 36 is connected to the output of the hysteresis stage 6, the source of PMOS 36 is connected to the voltage source VDDP and the drain of PMOS 36 is connected to the gate of the pass transistor. The gate of PMOS 38 is connected to ground (causing transistor 38 to remain ON), the source of PMOS 38 is connected to the voltage source VDDP and the drain of PMOS 38 is connected to the gate of the pass transistor. A pull up PMOS transistor 32 is provided between voltage source VDDP and the drain of the pass transistor 4 and the gate of the pull up transistor 32 is coupled to the output of the hysteresis stage 6.

Because PMOS transistor 38 is always ON, the PMOS transistor 38 acts as a resistor between the source voltage VDDP and the gate of the pass transistor 4, holding the gate voltage VG of the pass transistor 4 at 2.5 V. When the signal voltage applied to the pad 2 increases (low to high voltage transition), this increasing voltage is coupled to the gate of the pass transistor 4 through the coupling capacitor 12. The actual increase in the gate voltage VG will be dependent upon the resistance of the PMOS transistor 38. The increase in the gate voltage VG of the pass transistor 4 will ensure that the signal voltage at the pad 2 passed by the pass transistor 4 to the input of the hysteresis stage 6 is sufficient to switch the hysteresis stage 6. As soon as the hysteresis stage 6 turns the output on, which will occur when the input voltage exceeds Vih, the second PMOS transistor 36 coupled between the source voltage VDDP and the gate of the pass transistor 4 will be turned on, and therefore the gate voltage VG will be reduced to the normal VDDP level of 2.5 V. Accordingly, an increase in the input signal voltage to the pad 2 will cause an increase in the gate voltage of the pass transistor 4 which will in turn ensure that the input signal voltage is reliably passed to the input of the hysteresis circuit 6. As soon as the voltage passed to the hysteresis circuit 6 is sufficient to switch the hysteresis circuit 6, the PMOS transistor 36 is switched on, reducing the gate voltage VG to the normal source voltage VDDP, thereby preventing gate oxide stress in the transistors of the circuit.

The pull up transistor 32 provides a weak pull up which helps ensure that the input voltage to the hysteresis circuit 6 reaches the source voltage VDDP of 2.5 V when the signal voltage applied to the pad 2 is high.

It will be appreciated that the capacitance of the coupling capacitor 12 should be selected dependent on the expected worst case transition times of the signal. Typically, the capacitance is around 200 fF for a transition time of 20 ns. In the case where the signal voltage applied to the pad 2 is falling, the coupling effect of the capacitor 12 is undesirable as this would reduce the gate voltage of the pass transistor 4 and may therefore prevent the signal being passed by the pass transistor 4. The second PMOS transistor 36 remains on until the input voltage to the hysteresis circuit 6 falls below Vil, and therefore acts to maintain the gate voltage VG at the source voltage, VDDP of 2.5 V.

Figure 4A:
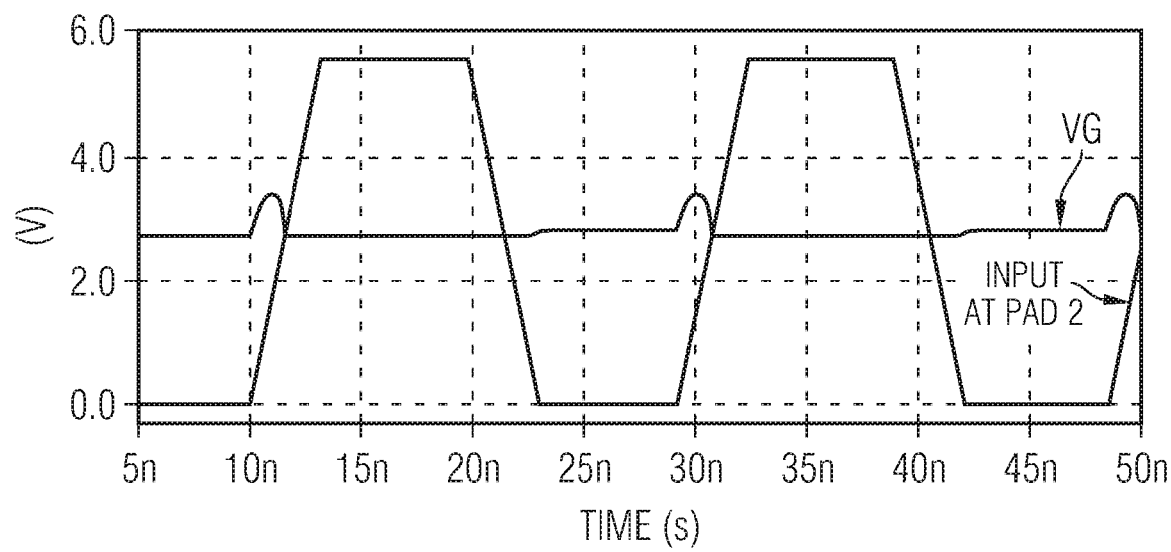
FIG. 4a is a graph showing the variation of gate voltage in response to the input on the pad in the circuit of FIG. 2.

FIG. 4a is a graph showing the variation of gate voltage in response to the input on the pad 2 in the circuit of FIG. 2 in an embodiment where the pass transistor 4 is an NMOS transistor. It will be seen that the gate voltage $V_9$ rises with the rising edge of the input waveform at the pad 2 and returns to the normal supply voltage (VDDX) as the input voltage becomes sufficient to turn on the hysteresis stage 6. However, at the falling edge of the input voltage waveform at the pad 2, the gate voltage to the pass transistor 4 remains stable.

Figure 4B:
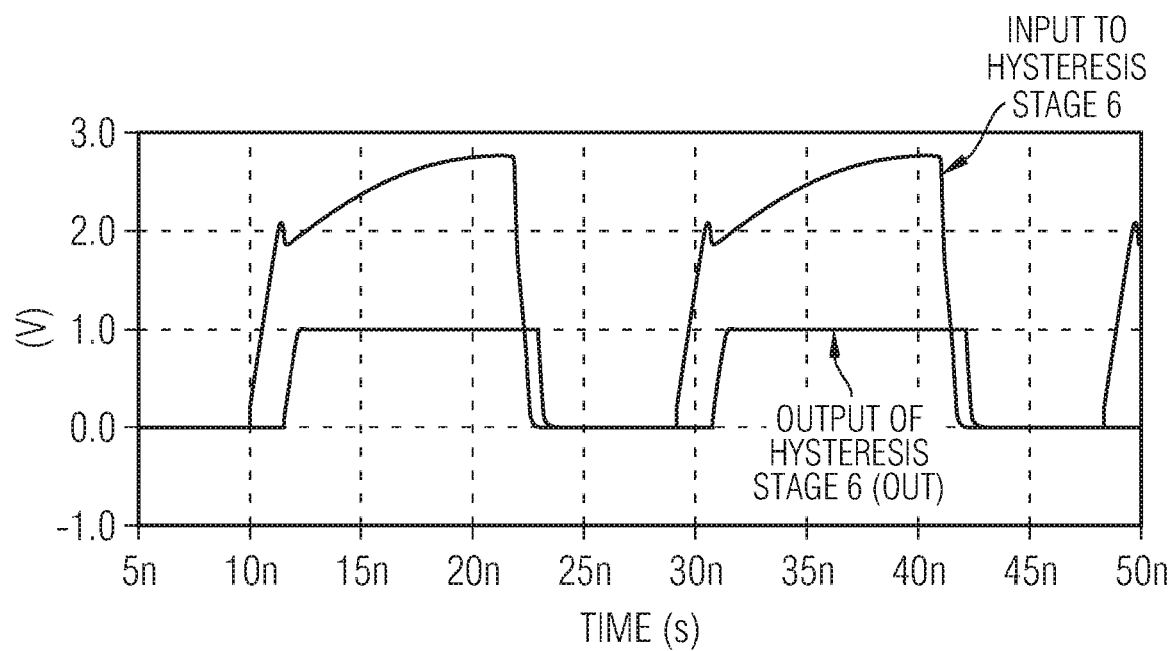
FIG. 4b is a graph showing the variation of the output of the hysteresis stage with the input from the pass transistor in the circuit of FIG. 2.

FIG. 4b is a graph showing the variation of the output of the hysteresis stage 6 with the input from the pass transistor 4 in the circuit of FIG. 2, again where the pass transistor 4 is an NMOS transistor. It will be seen that the drain voltage of the pass transistor 4 which is applied to the input of the hysteresis stage 6 remains within the working range of the stage 6 although, as shown in FIG. 4a, the input voltage exceeds the working range. The output of the hysteresis stage 6 is limited by the stage itself and thus the system is protected from over and under swings on the input waveform.

Various modifications to the embodiments of the present invention described above may be made. For example, other components and method steps can be added or substituted for those above. Thus, although the invention has been described above using particular embodiments, many variations are possible within the scope of the claims, as will be clear to the skilled reader, without departing from the invention.

What is claimed is:

1. An apparatus for protection against over voltages and/or under voltages, the apparatus comprising:
   an NMOS pass transistor through which an input voltage is applied, the input voltage varying between a low voltage and a high voltage;
   a gate control circuit coupled to a gate of the NMOS pass transistor to selectively vary a gate voltage of the NMOS pass transistor when the input voltage is transitioning from the low voltage to the high voltage or from the high voltage to the low voltage; and
   an input buffer including a hysteresis circuit coupled to the NMOS pass transistor, wherein the gate control circuit is arranged to return the gate voltage to a supply voltage when the input voltage passed to the input buffer exceeds a first switching voltage of the hysteresis circuit.

2. The apparatus according to claim 1, wherein the gate control circuit is arranged to increase the gate voltage only when the input voltage is switching from the low voltage to the high voltage.

3. An apparatus for protection against over voltages, the apparatus comprising:
   an NMOS pass transistor through which an input voltage is applied, the input voltage varying between a low voltage and a high voltage; and
   a gate control circuit coupled to a gate of the NMOS pass transistor to selectively vary a gate voltage of the NMOS pass transistor when the input voltage is transitioning from the low voltage to the high voltage,
   wherein the gate control circuit is arranged to increase the gate voltage only when the input voltage is switching from the low voltage to the high voltage; and
   wherein the gate control circuit is arranged to return the gate voltage to a supply voltage after the input voltage has switched from the low voltage to the high voltage.

4. An apparatus for protection against over voltages, the apparatus comprising:
   an NMOS pass transistor through which an input voltage is applied, the input voltage varying between a low voltage and a high voltage;
   a gate control circuit coupled to a gate of the NMOS pass transistor to selectively vary a gate voltage of the NMOS pass transistor when the input voltage is transitioning from the low voltage to the high voltage; and
   a pull-up transistor to pull up a voltage passed by the NMOS pass transistor to a source voltage.

5. An apparatus for protection against under voltages, the apparatus comprising:
- a PMOS pass transistor through which an input voltage is applied, the input voltage varying between a low voltage and a high voltage;
- a gate control circuit coupled to a gate of the PMOS pass transistor to selectively vary a gate voltage of the PMOS pass transistor when the input voltage is transitioning from the high voltage to the low voltage; and
- wherein the gate control circuit is arranged to decrease the gate voltage only when the input voltage is switching from the high voltage to the low voltage.

6. The apparatus according to claim 5, wherein the gate control circuit is arranged to return the gate voltage to a supply voltage after the input voltage has switched from the high voltage to the low voltage.

7. An apparatus for protection against under voltages, the apparatus comprising:
- a PMOS pass transistor through which an input voltage is applied, the input voltage varying between a low voltage and a high voltage;
- a gate control circuit coupled to a gate of the PMOS pass transistor to selectively vary a gate voltage of the PMOS pass transistor when the input voltage is transitioning from the high voltage to the low voltage; and
- a pull-down transistor to pull down a voltage passed by the PMOS pass transistor to ground voltage.

8. An apparatus for protection against under voltages, the apparatus comprising:
- a PMOS pass transistor through which an input voltage is applied, the input voltage varying between a low voltage and a high voltage;
- a gate control circuit coupled to a gate of the PMOS pass transistor to selectively vary a gate voltage of the PMOS pass transistor when the input voltage is transitioning from the high voltage to the low voltage; and
- an input buffer including a hysteresis circuit coupled to the PMOS pass transistor, wherein the gate control circuit is arranged to return the gate voltage to a supply voltage when the input voltage passed to the input buffer passes below a second switching voltage of the hysteresis circuit.

9. An apparatus for protection against over voltages and/or under voltages, the apparatus comprising:
- a pass transistor through which an input voltage is applied, the input voltage varying between a low voltage and a high voltage;
- a gate control circuit coupled to a gate of the pass transistor to selectively vary a gate voltage of the pass transistor when the input voltage is transitioning from the low voltage to the high voltage or from the high voltage to the low voltage; and
- a supply voltage different from a normal input voltage, the supply voltage coupled to the gate control circuit.

10. The apparatus according to claim 9, wherein the pass transistor comprises an NMOS transistor and wherein the gate control circuit is arranged to clamp the gate voltage at a supply voltage only when the input voltage is switching from the high voltage to the low voltage.

11. The apparatus according to claim 9, wherein the pass transistor comprises a PMOS transistor and wherein the gate control circuit is arranged to clamp the gate voltage at a supply voltage only when the input voltage is switching from the low voltage to the high voltage.

12. An apparatus for protection against over voltages and/or under voltages, the apparatus comprising:
- a pass transistor through which an input voltage is applied, the input voltage varying between a low voltage and a high voltage;
- a gate control circuit coupled to a gate of the pass transistor to selectively vary a gate voltage of the pass transistor when the input voltage is transitioning from the low voltage to the high voltage or from the high voltage to the low voltage; and
- wherein the gate control circuit includes a coupling capacitor coupling the input voltage to the gate of the pass transistor.

13. The apparatus according to claim 12, wherein the gate of the pass transistor is coupled to a supply voltage through one or more transistors.

14. An apparatus for protection against over voltages and/or under voltages, the apparatus comprising:
- a pass transistor through which an input voltage is applied, the input voltage varying between a low voltage and a high voltage;
- a gate control circuit coupled to a gate of the pass transistor to selectively vary a gate voltage of the pass transistor when the input voltage is transitioning from the low voltage to the high voltage or from the high voltage to the low voltage; and
- an input buffer coupled to the pass transistor.

15. The apparatus according to claim 14, in which the input buffer includes a hysteresis circuit.

16. An apparatus for protection against over voltages, the apparatus comprising:
- an NMOS transistor through which an input voltage is applied, the input voltage varying between a low voltage and a high voltage;
- means for increasing a gate voltage of the NMOS transistor only when the input voltage is transitioning from the low voltage to the high voltage; and
- means for returning the gate voltage to a supply voltage when the input voltage passed to an input buffer exceeds a switching voltage of a hysteresis circuit.

17. An apparatus for protection against under voltages, the apparatus comprising:
- a PMOS transistor through which an input voltage is applied, the input voltage varying between a low voltage and a high voltage;
- means for decreasing a gate voltage of the PMOS transistor only when the input voltage is transitioning from the high voltage to the low voltage; and
- means for returning the gate voltage to a supply voltage when the input voltage passed to an input buffer passes below a switching voltage of a hysteresis circuit.

18. A receiver comprising an apparatus for protection against over voltages and/or under voltages, the apparatus comprising:
- a pass transistor through which an input voltage is applied, the input voltage varying between a low voltage and a high voltage; and
- a gate control circuit coupled to a gate of the pass transistor to selectively vary a gate voltage of the pass transistor when the input voltage is transitioning from the low voltage to the high voltage or from the high voltage to the low voltage.

19. A method for protecting against over voltages and/or under voltages, the method comprising:
- applying an input voltage to a source of a pass transistor, the input voltage varying between a low voltage and a high voltage;

applying the input voltage to an input buffer including a hysteresis circuit;

selectively varying a gate voltage of the pass transistor when the input voltage is transitioning from the low voltage to the high voltage or from the high voltage to the low voltage, and returning the gate voltage to a supply voltage when the input voltage passed to the input buffer passes a switching voltage of the hysteresis circuit.

* * * * *